US008677304B2

(12) United States Patent
Drumm et al.

(10) Patent No.: US 8,677,304 B2
(45) Date of Patent: *Mar. 18, 2014

(54) TASK-BASED MULTI-PROCESS DESIGN SYNTHESIS

(71) Applicant: International Business Machines Corporation, Armonk, NY (US)

(72) Inventors: Anthony D. Drumm, Rochester, MN (US); Jagannathan Narasimhan, Mount Kisco, NY (US); Lakshmi N. Reddy, Briarcliff Manor, NY (US); Louise H. Trevillyan, Katonah, NY (US); Brian C. Wilson, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/785,438

(22) Filed: Mar. 5, 2013

(65) Prior Publication Data

US 2013/0185691 A1    Jul. 18, 2013

Related U.S. Application Data

(63) Continuation of application No. 12/972,879, filed on Dec. 20, 2010, now Pat. No. 8,407,652.

(51) Int. Cl.
*G06F 17/50* (2006.01)
(52) U.S. Cl.
USPC ........... 716/132; 716/100; 716/101; 716/106; 716/111
(58) Field of Classification Search
USPC .......................... 716/100, 101, 106, 111, 132
See application file for complete search history.

(56) References Cited

U.S. PATENT DOCUMENTS

| 5,452,239 | A | 9/1995 | Dai et al. |
|---|---|---|---|
| 5,483,470 | A | 1/1996 | Alur et al. |
| 5,629,861 | A | 5/1997 | Kim |
| 5,815,394 | A | 9/1998 | Adeli et al. |
| 5,920,489 | A | 7/1999 | Dibrino et al. |
| 6,678,875 | B2 | 1/2004 | Pajak et al. |
| 6,775,813 | B2 | 8/2004 | Chopra et al. |

(Continued)

OTHER PUBLICATIONS

U.S. Patent and Trademark Office, Office Action issued in related U.S. Appl. No. 12/972,879, dated Jul. 25, 2012.

(Continued)

*Primary Examiner* — Sun Lin
(74) *Attorney, Agent, or Firm* — Wood, Herron & Evans LLP

(57) ABSTRACT

A task-based multi-process design synthesis methodology relies on a plurality of child processes to assist a parent process in performing optimizations on an integrated circuit design. Objects from an integrated circuit design are grouped into subsets and assigned to child processes, with each child process performing a transform on each of the objects in the subset assigned to that child process and determining which of the objects in the subset are candidate objects for which performance of the transform has been successful. The child processes then notify the parent process of those objects that qualify as candidate objects, so that the parent process only has to perform the transform on the candidate objects, thereby relieving the parent process from the overhead associated with performing the transform on non-candidate objects for which the transform has been determined by the child processes as not being successful.

25 Claims, 8 Drawing Sheets

(56) References Cited

U.S. PATENT DOCUMENTS

| | | |
|---|---|---|
| 7,146,586 B2 | 12/2006 | Bohl et al. |
| 7,370,312 B1 | 5/2008 | Steckel |
| 7,530,047 B2 | 5/2009 | Wang et al. |
| 7,774,191 B2 | 8/2010 | Berkowitz et al. |
| 7,873,953 B1 | 1/2011 | Pritchard et al. |
| 7,886,241 B2 | 2/2011 | Bohl et al. |
| 7,913,194 B1 | 3/2011 | Baylor |
| 8,042,078 B2 | 10/2011 | Paruthi et al. |
| 8,065,640 B1 | 11/2011 | Richter et al. |
| 8,341,565 B2 * | 12/2012 | Drumm et al. ................. 716/104 |
| 8,392,866 B2 * | 3/2013 | Drumm et al. ................. 716/132 |
| 8,407,652 B2 * | 3/2013 | Drumm et al. ................. 716/132 |
| 2006/0107206 A1 | 5/2006 | Koskimies |
| 2007/0288854 A1 | 12/2007 | Koskimies |
| 2008/0222582 A1 | 9/2008 | Bohl et al. |
| 2008/0244476 A1 | 10/2008 | Fotakis et al. |
| 2009/0172630 A1 | 7/2009 | Wang et al. |
| 2010/0115478 A1 | 5/2010 | Pedenon et al. |
| 2010/0192155 A1 | 7/2010 | Nam et al. |
| 2010/0306720 A1 | 12/2010 | Pikus et al. |
| 2012/0030577 A1 | 2/2012 | Akolkar et al. |
| 2012/0159406 A1 | 6/2012 | Drumm et al. |
| 2012/0159417 A1 | 6/2012 | Drumm et al. |
| 2012/0159418 A1 | 6/2012 | Drumm et al. |

OTHER PUBLICATIONS

U.S. Patent and Trademark Office, Notice of Allowance issued in related U.S. Appl. No. 12/972,879, dated Nov. 21, 2012.

U.S. Patent and Trademark Office, Office Action issued in related U.S. Appl. No. 12/972,934, dated Apr. 13, 2012.

U.S. Patent and Trademark Office, Notice of Allowance issued in related U.S. Appl. No. 12/972,934, dated Nov. 2, 2012.

U.S. Patent and Trademark Office, Office Action issued in related U.S. Appl. No. 12/972,980, dated Mar. 14, 2012.

U.S. Patent and Trademark Office, Notice of Allowance issued in related U.S. Appl. No. 12/972,980, dated Aug. 3, 2012.

* cited by examiner

TASK-BASED MULTI-PROCESS DESIGN SYNTHESIS

CROSS-REFERENCE TO RELATED APPLICATIONS

This application is a continuation of U.S. patent application Ser. No. 12/972,879, filed on Dec. 20, 2010 by Anthony D. Drumm et al., issued as U.S. Pat. No. 8,407,652, and is related to the following applications filed on Dec. 20, 2010 by Drumm et al.: U.S. patent application Ser. No. 12/972,934, entitled "Task-Based Multi-Process Design Synthesis With Notification of Transform Signatures," issued as U.S. Pat. No. 8,392,866 and U.S. patent application Ser. No. 12/972,980, entitled "Task-Based Multi-Process Design Synthesis With Reproducible Transforms," issued as U.S. Pat. No. 8,341,565. The disclosures of these applications are incorporated by reference herein.

FIELD OF THE INVENTION

The invention is generally related to computers and computer software, and in particular, to computer software used in integrated circuit device design and synthesis.

BACKGROUND OF THE INVENTION

Integrated circuit devices, commonly known as chips, continue to become more powerful and complex as semiconductor manufacturing technologies have advanced. Whereas early integrated circuit devices included fewer than one hundred transistors, it is now common to integrate hundreds of millions of transistors into a single integrated circuit device. This increased transistor count enables some operations that once required several integrated circuit devices to now be implemented in a single integrated circuit device, often providing greater performance at a lower cost. For example, where previously a data processing system might require separate integrated circuit devices for a microprocessor, a memory, a bus interface, and a memory controller, advances in chip density now permit all of these functions to be integrated into the same integrated circuit device. Such devices are typically known as "systems on a chip" due to the high level of integration they provide.

Increases in chip density have also significantly affected the design methodologies used for integrated circuit chips. Rather than manually laying out individual transistors or logic gates in a design to obtain a desired logic function, typically the functional aspects of the design process are separated from the physical aspects. The functional aspects of a design are typically addressed via a process known as a logic design, which results in the generation of a functional definition of a circuit design, typically defined in a hardware description language (HDL) such as VHDL or Verilog. An HDL representation of a circuit is analogous in many respects to a software program, as the HDL representation generally defines the logic or functions to be performed by a circuit design. Moreover, by separating logic design from physical layout, functions are capable of being defined at a higher level of abstraction. Many design methodologies rely on the concept of hierarchical logic design, where circuits are defined in units and grouped together in one or more parent containers representing collections of units performing higher level functions.

In parallel with the creation of the HDL representation, a physical definition of a circuit design is created typically via a layout process, often referred to as integration, to essentially create a "floor plan" of logic gates and interconnects between the logic gates representing the actual physical arrangement of circuit elements on the manufactured integrated circuit. Automation tools have been developed to utilize predefined cells or blocks of complete circuits to assist with the layout, thus eliminating the need to work with millions of individual logic gates. For example, synthesis tools have been developed to generate Random Logic Macro (RLM) blocks from an HDL representation of a design, whereby an individual laying out a design is merely required to place the RLM blocks and connect them to one another to complete the circuit design. In addition, some designs incorporate blocks from off-the-shelf (OTS) logic blocks, which are reusable from design to design.

Once a physical definition is created, testing and simulation of the design may be performed to identify any potential timing and/or manufacturability issues, and once the design has been determined to meet these requirements, the design may be utilized to manufacture integrated circuits.

One manner of improving the performance of the tools used to design integrated circuit devices is to rely on parallelization to leverage the computing power of multiple processors and/or computer systems.

For example, one class of tools conventionally used in integrated circuit design are logic and physical synthesis tools. Synthesis is the process of transforming an input net list (a set of components interconnected by a set of wires) of a design into an optimized net list under certain desired optimization criteria. Physical synthesis additionally involves the task of mapping the components of the net list to a physical image to realize the design. Optimizations involved in physical synthesis typically consist of several complex steps and need to meet several constraints while achieving desired goals. It has been found that in many cases the physical mapping as well as the logical transformations are best dealt with simultaneously in order to achieve best results, a concept sometimes referred to as Placement Driven Synthesis (PDS). This problem space for PDS is usually very large leading to very long run times, so a significant need exists for reducing the run times of PDS and other logical and/or physical synthesis tools.

Conventional parallelization techniques in connection with integrated circuit design usually involve partitioning a problem into fairly independent sub-problems and processing each of them separately. These solutions of these sub-problems are then merged to obtain a solution for the original problem. However, while there are many problems that lend themselves to such partitioning it has been found that it is often difficult to partition the problem of physical and logical synthesis either logically or physically, which renders the task of parallelization even more difficult. This is because any PDS change made to the design can affect much of the rest of the entire design, or at least it is difficult if not impossible to tell a priori what effect a PDS change will have on other parts of the design.

Therefore, a significant need exists for an improved manner of parallelizing physical and logical synthesis operations to reduce runtime.

SUMMARY OF THE INVENTION

The invention addresses these and other problems associated with the prior art by providing a task-based multi-process design synthesis methodology that relies on a plurality of child processes to assist a parent process in performing optimizations on an integrated circuit design. Objects from an integrated circuit design are grouped into subsets and assigned to child processes, with each child process performing a transform on each of the objects in the subset assigned to that child process and determining which of the objects in the subset are candidate objects for which performance of the transform has been successful. The child processes then notify the parent process of those objects that qualify as candidate objects, so that the parent process only has to perform the transform on the candidate objects, thereby relieving the parent process from the overhead associated with performing the transform on non-candidate objects for which the transform has been determined by the child processes as not being successful. Typically, the child processes and the parent process use independent copies of the integrated circuit design so that modifications to the independent copies of the integrated circuit design by the child processes are not reflected in the copy of the integrated circuit design used by the parent process.

Therefore, consistent with one aspect of the invention, an integrated circuit design is optimized by using a parent process and a plurality of child processes executing on one or more processors. The parent process generates a set of objects from the integrated circuit design upon which to perform a transform. Each of the plurality of child processes performs the transform on each of a subset of objects from the set of objects, determines for each of the subset of objects whether such object is a candidate object for which performance of the transform has been successful, and notifies the parent process of any candidate object from the subset of objects for which performance of the transform has been determined to be successful. The parent process then performs the transform on each candidate object of which the parent process is notified by the plurality of child processes.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

Figure 1:
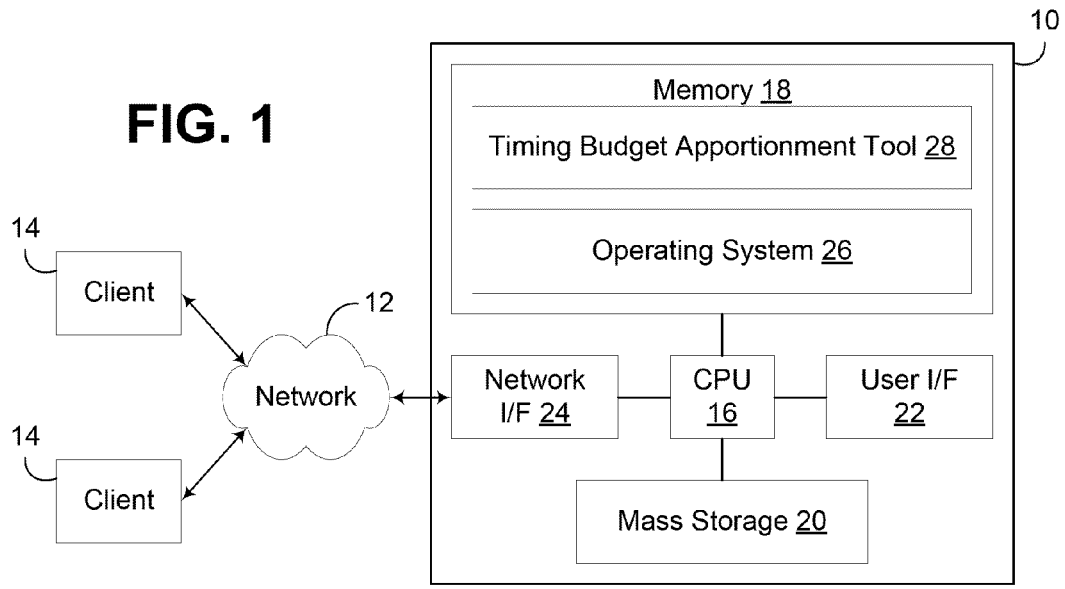
FIG. 1 is a block diagram of the principal hardware components in a computer system suitable for implementing a task-based multi-process synthesis consistent with the invention.

A common technique used in optimization is basically trial-and-error. A particular optimization function (called a transform) is given an object such as a pin or net. It examines the circuits in the vicinity of this object and decides if its transformation is possible. If so, it applies the transformation, analyzes the results, and then decides whether to leave the changes in place or back them out through an undo operation to revert the circuit to its original state.

Depending on the transform, the ratio of the number of successes to the number attempted ranges from fairly high (80% or better) to very low (less than 10%). Embodiments consistent with the invention make use of this characteristic to parallelize the optimization. In particular, objects from an integrated circuit design are grouped into subsets and assigned to child processes, with each child process performing a transform on each of the objects in the subset assigned to that child process and determining which of the objects in the subset are candidate objects for which performance of the transform has been successful.

In one implementation, the child processes notify a parent process of those objects that qualify as candidate objects, so that the parent process only has to perform the transform on the candidate objects, thereby relieving the parent process from the overhead associated with performing the transform on non-candidate objects for which the transform has been determined by the child processes as not being successful.

In another implementation, the child processes provide result data, e.g., in the form of a transform signature, including data such as instructions or hints that a parent process can use to reduce the overhead required to perform the same transform that a child process has performed in the parent process.

In yet another implementation, reproducible transforms are used to enable design synthesis operations to be reproducible from run to run. Child processes may perform transforms on objects using the same initial state of an integrated circuit design for each object, by undoing the results of each transform, regardless of success. In addition, a parent process may track the return of status information from child processes and perform the transform on objects in a controlled sequence.

Typically, the child processes and the parent process use independent copies of the integrated circuit design so that modifications to the independent copies of the integrated circuit design by the child processes are not reflected in the copy of the integrated circuit design used by the parent process. Moreover, by providing the parent and child processes with independent copies of the integrated circuit design, the processes are able to perform the transform while having a complete view of the integrated circuit design.

An integrated circuit design within the context of the invention may include any number of different designs that represent various aspects of an integrated circuit, e.g., a logical design, a physical design, or a combined logical/physical design such as used in connection with PDS. Objects from a design may include, for example, logic gates, pins, nodes, cells, blocks, multiplexers, register elements, latches, nets from a net list, etc., as well as more complex collections of such entities.

A transform within the context of the invention may include practically any potential optimization that can be performed on an integrated circuit design, and that is capable of being tested to determine whether performance of the transform improves the design. A transform is therefore a type of modification to a design in a controlled manner to transform the design in some fashion. As but one example, one type of transform is an inverter removal optimization, where redundant pairs of inverters are detected and removed. Another type of transform is a buffering optimization where buffers are inserted into long wires to improve signal speed, or inserted to unload critical connections in the case of overloaded sinks. Another type of transform is resizing, which involves selecting a new cell from the technology cell library with different timing and load driving characteristics (usually designed with different sized transistors). Still another type of transform relates to physical movement of objects, e.g., moving a gate from one location to another to improve some criterion. This type of transform typically does not alter the logic connectivity of the circuit, and is strictly a physical design change.

Therefore, a transform may include operations such as logic decomposition, converting AND/OR gates to NAND gates and vice versa, resizing, inverter removal, buffer removal, buffer insertion, buffer tree optimization, wire sizing, placement move, factoring and decomposition, composition (e.g., combining two gates into one), redundancy removal, transduction, global flow, remapping, pin swapping, cloning, common term elimination, inverter pushing (e.g., variations of DeMorgan operations). Some of the aforementioned transforms may be used for achieving more than one objective, e.g., resizing, which may be used to reduce delay (i.e., to improve slack), to correct or improve electrical violations (e.g., to meet some target slew or transition time), or to reduce area or power by sizing down gates that easily meet other criteria like timing or slew. In addition, some of the aforementioned transforms may be used typically (not necessarily exclusively) only during logic synthesis (e.g., redundancy removal), whereas others are typically physical in nature (e.g., moving a box to improve routing or timing or power, or resizing a wire). Practically any transform that is potentially capable of optimizing or otherwise improving an integrated circuit design may be performed consistent with the invention, so the invention is therefore not limited to the particular transforms enumerated herein.

Other variations and modifications will be apparent to one of ordinary skill in the art. Therefore, the invention is not limited to the specific implementations discussed herein.

Hardware and Software Environment

Turning now to the drawings, wherein like numbers denote like parts throughout the several views, FIG. 1 illustrates an apparatus 10 within which task-based multi-process synthesis consistent with the invention may be performed. Apparatus 10 in the illustrated embodiment is implemented as a server or multi-user computer that is coupled via a network 12 to one or more client computers 14. For the purposes of the invention, each computer 10, 14 may represent practically any type of computer, computer system or other programmable electronic device. Moreover, each computer 10, 14 may be implemented using one or more networked computers, e.g., in a cluster or other distributed computing system. In the alternative, each computer 10, 14 may be implemented within a single computer or other programmable electronic device, e.g., a desktop computer, a laptop computer, a handheld computer, a cell phone, a set top box, etc., or in a high performance computer such as a massively parallel computer or supercomputer.

Computer 10 typically includes a central processing unit (CPU) 16 including at least one hardware-based microprocessor coupled to a memory 18, which may represent the random access memory (RAM) devices comprising the main storage of computer 10, as well as any supplemental levels of memory, e.g., cache memories, non-volatile or backup memories (e.g., programmable or flash memories), read-only memories, etc. In addition, memory 18 may be considered to include memory storage physically located elsewhere in computer 10, e.g., any cache memory in a processor in CPU 16, as well as any storage capacity used as a virtual memory, e.g., as stored on a mass storage device 20 or on another computer coupled to computer 10. Computer 10 also typically receives a number of inputs and outputs for communicating information externally. For interface with a user or operator, computer 10 typically includes a user interface 22 incorporating one or more user input devices (e.g., a keyboard, a mouse, a trackball, a joystick, a touchpad, and/or a microphone, among others) and a display (e.g., a CRT monitor, an LCD display panel, and/or a speaker, among others). Otherwise, user input may be received via another computer or terminal.

For additional storage, computer 10 may also include one or more mass storage devices 20, e.g., a floppy or other removable disk drive, a hard disk drive, a direct access storage device (DASD), an optical drive (e.g., a CD drive, a DVD drive, etc.), a storage area network, and/or a tape drive, among others. Furthermore, computer 10 may include an interface 24 with one or more networks 12 (e.g., a LAN, a WAN, a wireless network, and/or the Internet, among others) to permit the communication of information with other computers and electronic devices. It should be appreciated that computer 10 typically includes suitable analog and/or digital interfaces between CPU 16 and each of components 18, 20, 22 and 24 as is well known in the art. Other hardware environments are contemplated within the context of the invention.

CPU 16 desirable includes multiple processors, multi-core processors, and/or symmetric multithreading (SMT)-capable processors such that the workload of a design synthesis routine may be distributed among multiple hardware threads of execution. Moreover, in some implementations, a design synthesis routine may be distributed among multiple networked computers. As will become more apparent below, the workload of a design synthesis routine is handled by multiple processes, and as such, any hardware and/or software environment capable of hosting multiple processes typically may be used.

Computer 10 operates under the control of an operating system 26 and executes or otherwise relies upon various computer software applications, components, programs, objects, modules, data structures, etc., as will be described in greater detail below (e.g., synthesis tool 28). Moreover, various applications, components, programs, objects, modules, etc. may also execute on one or more processors in another computer coupled to computer 10 via network 12, e.g., in a distributed or client-server computing environment, whereby the processing required to implement the functions of a computer program may be allocated to multiple computers over a network.

In general, the routines executed to implement the embodiments of the invention, whether implemented as part of an operating system or a specific application, component, program, object, module or sequence of instructions, or even a subset thereof, will be referred to herein as "computer program code," or simply "program code." Program code typically comprises one or more instructions that are resident at various times in various memory and storage devices in a computer, and that, when read and executed by one or more processors in a computer, cause that computer to perform the steps necessary to execute steps or elements embodying the various aspects of the invention. Moreover, while the invention has and hereinafter will be described in the context of fully functioning computers and computer systems, those skilled in the art will appreciate that the various embodiments of the invention are capable of being distributed as a program product in a variety of forms, and that the invention applies equally regardless of the particular type of computer readable media used to actually carry out the distribution. Examples of computer readable media include tangible, recordable type media such as volatile and non-volatile memory devices (e.g., memory 18), floppy and other removable disks, hard disk drives, magnetic tape, and optical disks (e.g., CD-ROMs, DVDs, etc.), among others.

In addition, various program code described hereinafter may be identified based upon the application within which it is implemented in a specific embodiment of the invention. However, it should be appreciated that any particular program nomenclature that follows is used merely for convenience, and thus the invention should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

Those skilled in the art will recognize that the exemplary environment illustrated in FIG. 1 is not intended to limit the present invention. Indeed, those skilled in the art will recognize that other alternative hardware and/or software environments may be used without departing from the scope of the invention.

Task-Based Multi-Process Design Synthesis

As noted above, conventional parallelization techniques in connection with integrated circuit design usually involve partitioning a problem into fairly independent sub-problems and processing each of them separately. These solutions of these sub-problems are then merged to obtain a solution for the original problem. However, while there are many problems that lend themselves to such partitioning it has been found that it is often difficult to partition the problem of physical and logical synthesis either logically or physically, which renders the task of parallelization even more difficult. This is because any change made to a design can affect much of the rest of the entire design, or at least it is difficult if not impossible to tell a priori what effect a change will have on other parts of the design.

Described herein are a number of different approaches for parallelization of placement driven synthesis (PDS), i.e., a sequence of logic transformations (or transforms) that are aware of the physical environment in which they operate. This set of transformations $\{t_1, t_2 \ldots t_m\}$ may be considered to be grouped into a sequence of commands (cmds) $C=\{c_1, c_2 \ldots c_m\}$ where each ci is a subset of transforms in the set $T=t_{i1}, t_{i2} \ldots t_{ic}\}$. It will be appreciated, however, that while the disclosure hereinafter focuses on PDS, the principles of the invention may apply to other forms of physical and/or logical design synthesis, as well as other optimization techniques for integrated circuit designs. Therefore, the invention is not limited to PDS-related optimizations.

Figure 2:
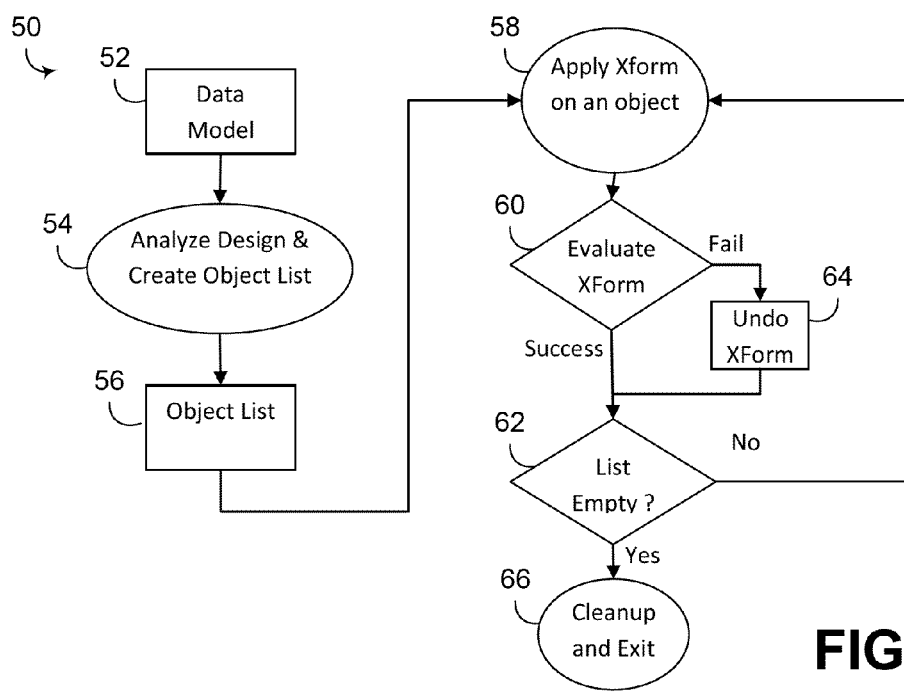
FIG. 2 is a flowchart illustrating an exemplary sequence of operations for a task-based design synthesis process capable of being implemented in the computer of FIG. 1.

Embodiments consistent with the invention rely on task-based multi-process synthesis, which relies on task based partitioning. FIG. 2, for example, shows a simplified flow 50 describing the operations that may be used to perform transformations on a design. A data model 52 for the design, e.g., a net list, is first analyzed in block 54 to obtain a set of objects $O=\{o_1, o_2, \ldots o_n\}$ 56 on which a commands can potentially be applied to improve the design. This set of objects may include gates, nets, pins etc. and is alternatively referred to as a list of objects. While not required, a list may be ordered according to some set of criteria. The criteria may be for example timing related, electrical property based, geography based, etc.

A command, which performs one or more transformations on an object, is then applied on each object of the list in sequence (block 58). During the application, the command is evaluated (block 60), and if the design improves, control passes to block 62 to determine if more objects remain in the list, and if so, returns control to block 58 to apply the command to the next object in the list. If the design deteriorates, however, block 64 undoes the command before passing control to block 62. Once all objects in the list have been processed, block 62 passes control to block 66 to cleanup and exit the routine.

In task based multi-process PDS each command is parallelized separately, and multiple commands may be utilized to optimize a design. Each command works on its own list of objects to optimize the design. The command may include transforms that are quite complex to perform and thus quite time consuming. The list of objects O on which the command is attempted may be very large requiring the command to be applied on many objects. However, while a command may be run on a large set of objects, the actual number of objects on which the command is successful can often be quite small. One may define success ratio $s_r$ as the number of objects on which a command is successful divided by the total number of objects on which it is tried. If n is the number of objects on which a transform is attempted and $n_s$ is the number of objects on which it is applied successfully, then $$s_r = \frac{n_s}{n}.$$

In many instances, this success ratio $s_r$ is relatively small and that the outcome of evaluations performed after application of the command is negative more often than not. Unfortunately it is not possible to avoid this computation as it is essential for determining those objects for which a command or transform results in a success. However, the flow illustrated in FIG. 2 does offer an enormous opportunity for run time improvement by parallelization. Evaluations can be performed in parallel using multiple processes (referred to herein as child processes) in order to extract a small set of objects on which success is relatively assured. The command can be then run sequentially on this small set of successful objects by another process (referred to herein as a parent process, which may also function as a child process in some embodiments) thus greatly reducing the required computation time. The parallelization models described hereinafter are predicated on this underlying principle.

One PDS approach described hereinafter relies on design partitioning, where the design as well as the placement image space are partitioned up front. This partitioning is based upon a coarse placement of the design on the image space. At the end of this step there are m image partitions each with a unique design partition assigned to it. PDS may be run simultaneously on each of these m image space design partitions tuples. Various synchronization points may be established to maintain consistency of timing and other characteristics across image boundaries during the PDS runs. After the m PDS runs are completed the results may be combined by appropriately stitching across the image boundaries to complete the design.

Using the aforementioned task-based process, limits on the number of processes such a system can tolerate can be analyzed. Discussed herein are two different scenarios under which the analysis is performed. In the first it is assumed that the children complete their respective tasks on all the objects in their respective subsets before the parent starts processing the parent subsets. This case is referred to herein as static task based multi-process PDS. In the second it is assumed that the parent starts its processing as soon as the first "nugget", or candidate object, is obtained from the child; this case is referred to as dynamic task based multi-process PDS. In both these cases a relationship is established between the desired number of processes and the success ratio. If the success ratio can be determined then it is possible to set theoretical limits on the number of processors.

In the static approach it is assumed that all children complete their evaluation on all the objects in their respective subsets before the parent starts processing the parent subsets. The advantage of this approach is that the order in which the parent processes successful objects received back from the children is the same as that in a sequential approach. However this does not mean that the same subset of objects will be processed by both the sequential as well as the multi-process versions since children could have evaluated objects differently from the sequential approach. This is due to the fact that their respective partitions may not have the same view of the design as the sequential process. The order however may be maintained.

Let $tc_{max}$ be the maximum of the computation times spent by the child processes, $t_o$ be the parent overhead of managing the child processes, and $t_p$ the time required by the parent to process the small set of successes. For simplicity start with the assumption that all children finish processing before the parent works with the success set. The total time required for the application of a command is $T=t_c+t_o+t_p$. If there are n objects to be processed and the average time required to process each object is t, then the time required to analyze application of the command on the entire set objects is nt. If m child processes are used to perform this analysis and the load is distributed evenly amongst the children, then $$tc_{max} \cong \frac{nt}{m},$$

and the time required to evaluate the command $$T_c = t_o + \frac{nt}{m} + t_p,$$

where $t_p=s_r nt$ is the time taken by the parent to reprocess the successful objects. In the sequential case the time taken to process these objects is T=nt. As long as $T_c$ is substantially greater than T, parallelization will be effective. Typically starting new processes is extremely fast and this overhead can be neglected for the purposes of this analysis. The condition for parallelization to be effective is therefore $$\frac{nt}{m} + s_r nt \le nt \text{ or } m \ge \frac{1}{1-s}.$$

Figure 3:
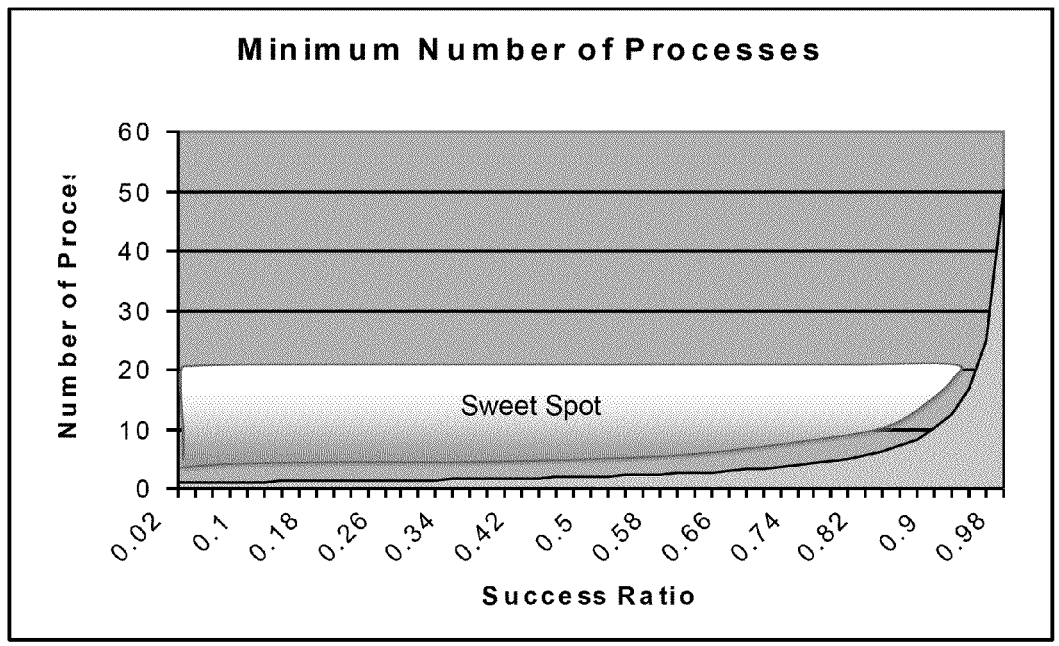
FIG. 3 is a graph of number of processes vs. success ratio for a static task-based multi-process design synthesis process.

On the higher end is m only limited by computing resources. FIG. 3 shows this relationship, with a "sweet spot" for deciding the number of processes also highlighted.

It is anticipated that in the final processing by the parent a very high success ratio can be achieved. While this analysis provides theoretical limits, it must be understood that due to practical considerations only a portion of the region above the line is actually of value. These considerations include the overhead of managing parallel processes, memory overhead like copy on write, etc. Spawning a very large number of processes could also lead to inefficiencies because as the children process their respective partitions they may create numerous copies of the design in memory leading to excessive paging.

Figure 4:
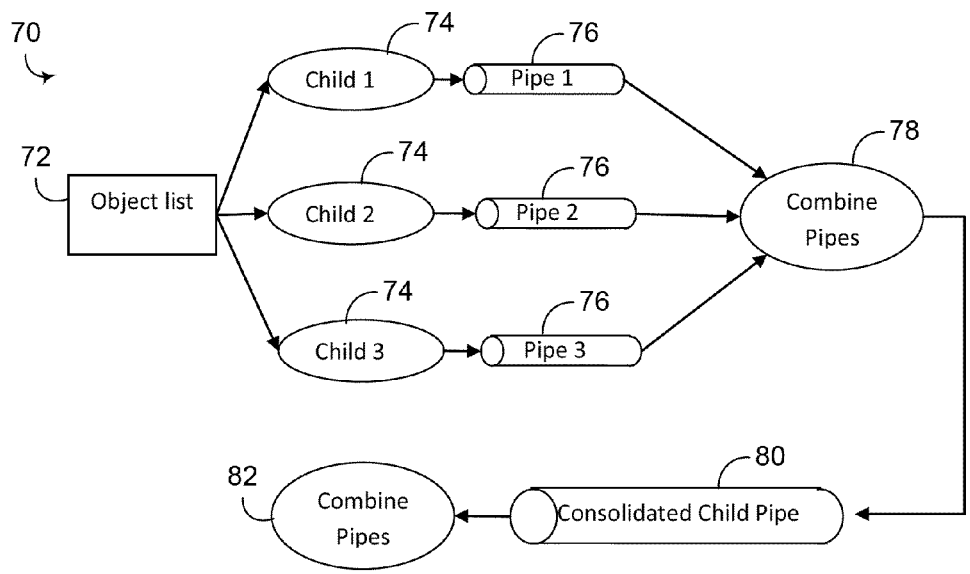
FIG. 4 is a flowchart illustrating an exemplary sequence of operations for a dynamic task-based multi-process design synthesis process capable of being implemented in the computer of FIG. 1.

In the dynamic approach objects are pipelined to children from the parent for evaluation and then information about successful evaluations of objects is pipelined back to the parent. This results in a considerable savings in time at the expense of a greater deviation from sequential PDS. The sequence in which objects are received by the parent depends upon the rate at which different children fill the pipe and may differ from sequential PDS. A flow chart illustrating this approach is shown in FIG. 4.

In particular, a dynamic task-based multi-process PDS routine 70 distributes subsets of objects from an object list 72 to a plurality of child processes 74. Each child process 74 outputs successful, or candidate objects through associated pipes 76, which are then combined at block 78. The combined candidate objects are then streamed via a consolidated child pipe 80 for processing by the parent process in block 82.

The dynamic process can be analyzed in a similar manner to the static process. In this scheme all children will typically be working at full capacity until they have exhausted all the objects in the original list to be evaluated. However, since a large number of these evaluations may be unsuccessful, the parent could remain idle until such a successful object is returned. Let N be the average number of objects in the pipe containing potential candidates to be reevaluated by the parent. On average N is also the number of objects processed by the parent after all children terminate. As the number of children m is increases the parent pipe will fill up faster speeding up the child evaluation process. However, this will be offset by the time required by the parent to complete reevaluation as the queue size N at its input will be greater. One needs to strike an appropriate balance between these two conflicting outcomes.

Assume that the evaluations of all the children have the same success rate. Let $t_e$ be the time required to evaluate and update each object. Typically, the evaluation time involves performing the update, computing a metric and if the metric has deteriorated then reverting to the pre-transform state for the object. Computation of the metric is costly and consumes the bulk of $t_e$. The average arrival rate at each child pipe is $$\frac{s_r}{t_e}$$

objects per unit time. One may assume that this arrival rate is distributed according to the Poisson distribution. The consolidated child pipe is filled at m times that rate and hence the arrival rate at the input to the parent is $$\frac{ms_r}{t_e}.$$

Due to the additive property of the Poisson distribution the arrival rate at this pipe also follows the Poisson distribution. Assuming that the parent takes the same time $t_e$ to evaluate the object, the service rate is $$\frac{1}{t_e}.$$

Assuming further that the service rate is greater than the arrival rate, that is $$\frac{1}{t_e} \geq \frac{msr}{t_e}$$

and applying the single server queuing model the average length of the queue in the consolidate pipe may be computed as $$N = (1 - ms_r)\sum_{1}^{n} k(ms_r)^k = \frac{ms_r}{1 - ms_r}.$$

Using the above as a basis one may determine the desired number of children. Note that the task based multi-process approach must necessarily take at least $ns_r t_e$ time since the parent needs to reevaluate $ns_r$ objects. The maximum amount of time that PDS can take is when the children process all the unsuccessful objects first before making successful objects available for the parent. This means that each child needs to complete $$\frac{n}{m} - \frac{ns_r}{m} = \frac{n}{m}(1 - s_r)$$

evaluations on the average before embarking on the $$\frac{ns_r}{m}$$

successful evaluations. As soon as a successful object is available the parent reevaluation process starts and the total time spent is $$\frac{n}{m}(1 - s_s)t_e + ns_r t_e.$$

The time required for the sequential system is nt. Therefore for the multi-process system to save time $$\frac{nt_e}{m}(1 - s_r) + ns_r t_e \leq nt_e \text{ or } \frac{1}{m}(1 - s_r) \leq 1 - s_r \text{ or } m \geq 1.$$

On the other hand for the parent to be busy on the average there must be at least one item in the queue. If the average length of the consolidated child queue (N) is at least one then the parent is always reevaluating and the total process will on average complete in $ns_r t_e$ time. The arrival rate at the input to the parent is $$\lambda = \frac{ms_r}{t_e},$$

and the service rate $$\mu = \frac{1}{t_e},$$

leading to an arrival to service rate ratio of $$\rho = \frac{\lambda}{\mu} = ms_r.$$

If one assumes mat the arrival and service rates are Poisson distributions, using a single server queuing model (M/M/1) one sees that $$N = \frac{\rho}{1 - \rho} = \frac{ms_r}{1 - ms_r} \geq 1 \text{ or } m \geq \frac{1}{2s_r}.$$

This means that one needs $$\frac{1}{2s_r}$$

processes to keep the system busy on average. Anything mole man $$\frac{1}{2s_r}$$

is even more likely to keep the system busy and less than $$\frac{1}{2s_r}$$

is not as likely to keep the system busy. This simple analysis provided here can be extended using other probability density distributions $pd(t_e)$ of $t_e$.

Figure 5:
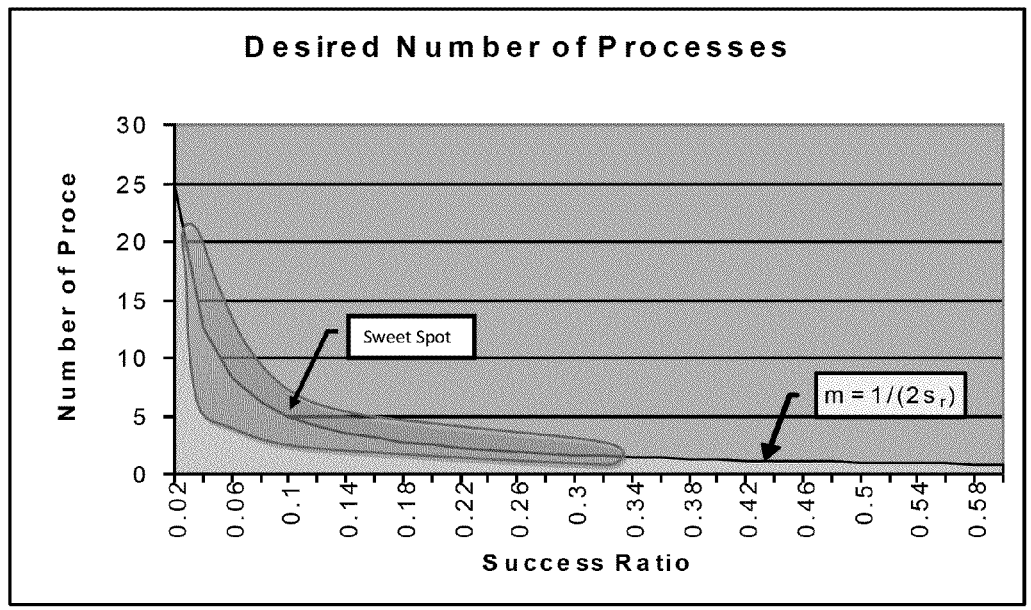
FIG. 5 is a graph of number of processes vs. success ratio for a dynamic task-based multi-process design synthesis process.

FIG. 5 shows a plot between the number of child processes and success ratio. A good number of processes to use will be just above the line. The shaded region is the sweet spot to use in this case. This will ensure that on the average the consolidated child pipe is kept full, while at the same time not wasting undue system resources to speed evaluation that will overwhelm the parent.

In the implementations already discussed, despite all the parallelism that has been introduced in the evaluation of objects, the application of the transforms by the parent is essentially a sequential process. In the base implementation application of a transform by the parent includes a complete reevaluation of the application of the transform on the object. This is necessary because evaluations performed by the child could have been made using a different state of the design (child's view) and hence cannot be trusted by the parent.

In other implementations, however, it may be desirable to pass additional result data from a child to a parent to reduce the workload of the parent in terms of evaluating an object. This result data returned by the children about a specific object may be referred to as a signature. The children already evaluate the transform on each object. For each successful evaluation, a child can plot a course of actions that the parent should take to apply a transform instead of merely returning the success status. The process of executing these actions may be referred to as signature actions or acting on a signature. One may denote by $t_a$ the time taken for a signature action. Any gain in performance is predicated upon $t_a$ being less than $t_e$ since otherwise the actions would not have been suggested in the first place. In general $t_a$ is very much smaller than $t_e$. One may define the signature strength $$ss = \frac{t_e}{t_a}.$$

This is also the inverse of the action to evaluation time ratio defined as $$s_a = \frac{t_a}{t_e}.$$

Using the queuing model described above, the service rate of the parent may be increased to $$\mu = \frac{1}{t_a}.$$

Recalling that the arrival rate at the parent is $$\lambda = \frac{ms_r}{t_e}$$

one may see that the arrival to service rate ratio may be designated as $$\rho = \frac{\lambda}{\mu} = ms_r s_a.$$

Any extra penalty incurred by a child in creating the signature can be neglected since it is very small and is incurred only when the evaluation is successful. Since $s_a \ll 1.0$ the value of $\rho$ is much smaller than when there was no action based retrieval. Using the same explanation as above, one may see that the parent can now support a greater number of children given by $$m \geq \frac{1}{2 s_r s_a}$$

greatly decreasing the turnaround time of the application. This is because the predominantly sequential part of the entire process has been speeded up considerably.

Figure 6:
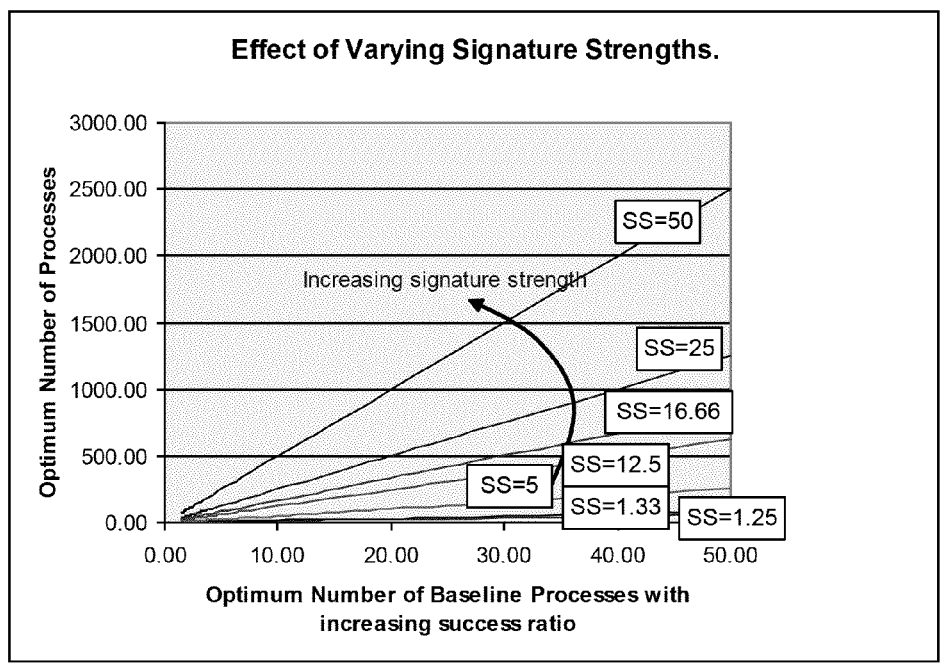
FIG. 6 is a graph of signature strength based upon optimum number of processes.

FIG. 6 shows the effect of signature strength on the optimum number of processes. The x-axis shows the optimum number of processes for increasing success ratio. Each plot shows on the y-axis the optimum number of processes for different signature strengths. The linear increase in this number can be exploited to obtain considerable speed up in turnaround time.

Various implementations of task-driven multi-process PDS are envisioned. In two implementations discussed below, children return successful objects to the parent via a pipe. The two implementations differ in the way the object list is partitioned and assigned to the children.

In one implementation, referred to as external partitioning, the set of objects in the design are partitioned m ways. Each partition is assigned to a child that is then forked out. Each child sees the entire design but only processes the object sub-list that is assigned to it. This method leverages all existing and can be implemented with controls set up outside the source code implementing the driver. However, in order to ensure that the load assigned to the various children is well balanced ingenuity may need to be exercised in creating the partitions. The onus of load distribution is on the parent. It may be difficult in some circumstances to cover all cases, leading to situations where the load is not optimally distributed between the child processes.

Figure 7:
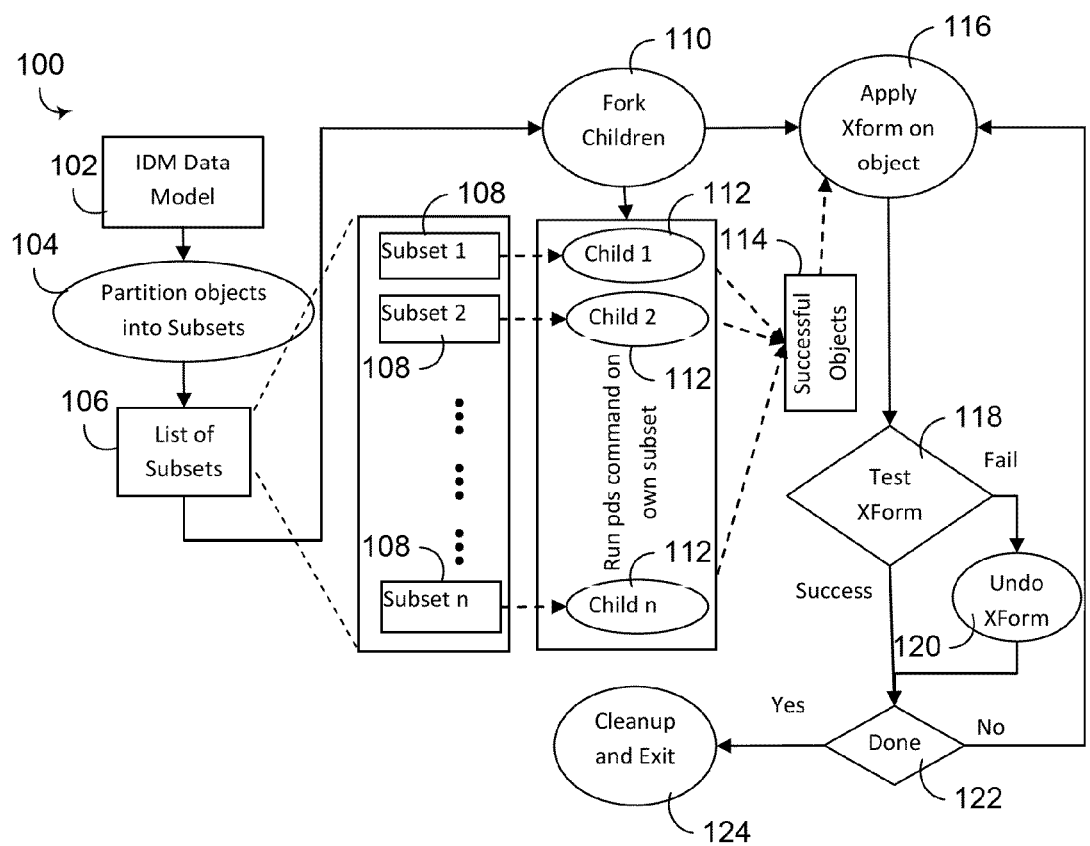
FIG. 7 is a flowchart illustrating an exemplary sequence of operations for a task-based multi-process design synthesis process utilizing external partitioning.

FIG. 7, for example, illustrates an implementation 100 where a data model 102 is partitioned by a parent into subsets (block 104), generating a list of subsets 106. At block 110, the parent forks a plurality of child processes 112. Child processes 112 process their respective subsets, and output successful, or candidate objects 114, which are processed by the parent at block 116, by applying the desired transform to each candidate object. The result of the transform is then tested (block 118), and if unsuccessful, the transform is undone (block 120). Once undone, or if the transform was successful, block 122 loops back to block 116 until all candidate objects have been processed by the parent. Once all objects have been processed, the parent cleans up and exits in block 124, e.g., by killing all child processes.

Greater independence between the subsets typically ensures a greater success ratio for the parent. This is because the effects of a commands performed by a child are not seen by any of the other children. Since each child operates in its own environment without knowledge of the application of commands in other children, it is possible for the parent subset to be slightly different from the set that would have been successful in the single processor application of the command. This could lead to different results between the single processor and multi-processor cases. Since the spirit of the single processor algorithm is maintained these differences will be marginal at worst. This method is also fault tolerant in that if any child should abort then only the object set associated with that child will not be processed. The rest of the processing will proceed and synthesis will complete with perhaps slightly degraded quality.

Figure 8:
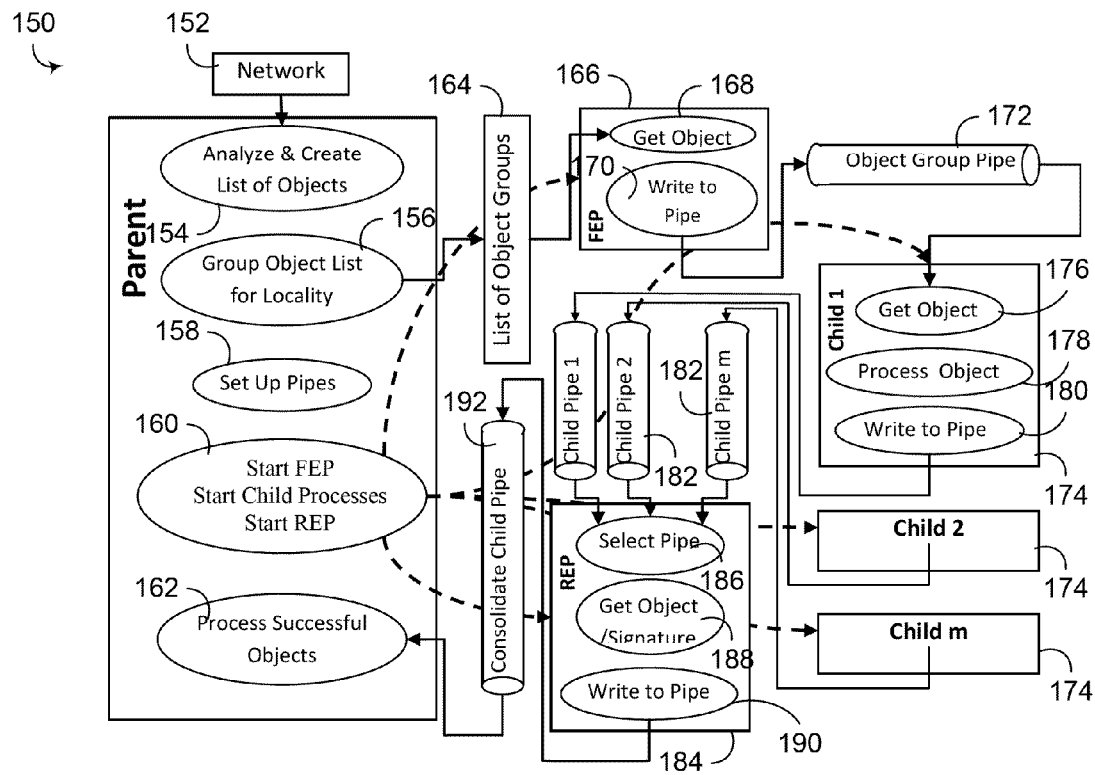
FIG. 8 is a flowchart illustrating an exemplary sequence of operations for a task-based multi-process design synthesis process utilizing integrated transform drivers and capable of being implemented in the computer of FIG. 1.

FIG. 8 illustrates an alternate implementation 150 that relies on integrated transform drivers (ITDs). In this scheme, parallelism is integrated more tightly within the drivers. The parent pipelines its object list to the children and receives a parent list in a return pipeline. The driver may be implemented either inside the transform or outside the transform. In either case the parent creates a front end process (FEP) that accepts the object list and pipelines it to the children that it spawns. As a result any child that is free will pick up the next object in the pipeline and continue evaluation as outlined earlier. This ensures that the children are kept fully busy until the pipe is completely exhausted an all objects have been evaluated. The object list created by the parent is pipelined to the children from within a driver that calls the transform.

As shown in FIG. 8, a design (network 152) is analyzed by the parent to create a list of objects (block 154), and the objects are grouped for locality (block 156). The parent then sets up pipes (block 158), and in block 160 starts an FEP 166, child processes 174 and rear end process (REP) 184.

FEP 166 takes a list of object groups 164 and retrieves objects (block 168) and writes each object (block 170) to an object group pipe 172. Each child 174 gets objects from pipe 172 (block 176), processes those objects by performing transforms thereon (block 178) and writes the results to an associated child pipe 182 (block 180). REP 184 then selects child pipes 182 (block 186) and retrieves results therefrom (block 188). REP 184 then writes results to a consolidated child pipe 192 (block 190). The parent process then processes successful objects in block 162.

It may be desirable to meet various constraints in order to optimize the performance of the implementation illustrated in FIG. 8.

For example, in general the load is more evenly distributed amongst the children in the integrated driver implementation. The scheme may run sub-optimally when elements from the same group are distributed amongst different children. This may cause different children to be working in conflicting ways on the same design. For example if the driver is timing based and the objects are nets ordered by criticality, then it may be more desirable to have the same child process all nets belonging to the same critical path. Otherwise, it is possible that recommendations made by children to the parent are conflicting resulting in unnecessary work. This can be remedied by grouping objects accordingly to ensure that such conflicts are avoided. In some instances, however, grouping may introduce a load imbalance that must be carefully weighed in.

In addition, a primary purpose of the front end process is to eliminate any possibility of a deadlock. Besides, the front end process may be designed to allow for such sub-setting that enables improvement in quality of result (QOR). The object list may be pipelined as an object subset list to the children to meet such criteria. The FEP can also be used to reorder the object subset list and to perform any other preprocessing like filtering of the list that may be of value.

Further, after the children process each object that they pick up from the object group pipe, they send those objects on which the evaluation is successful back through REP to a return pipe that is processed by the parent. The REP can also be used to perform some post processing of the parent list in order to improve both the speed and quality of the transform. The REP can also be used to create information that can simplify the parent's evaluation of applying the transformation in order to save computation time.

Each child may also provide a sequence of actions that the parent should take for each object evaluated successfully by the child. For example, in the case of resizing of a gate, the child may recommend a modified gate size to be evaluated by the parent. The parent may then evaluate only one gate size as opposed to trying every possible size for the gate. In other cases the child may recommend a set of nodes where timing must be checked in order to accept a change that the child found successful. This leads to the design of a set of basic actions using which feedback can be provided by the children to ease the work that the parent needs to perform.

In addition, in some implementations, reproducibility of results may be of paramount importance to designers. Reproducibility allows for the designer to try alternatives and revert back to a known state of the design if they do not prove to be effective. Furthermore, lack of such consistency from run to run will lead to uncertainty, which is often unacceptable.

The reasons for such inconsistency are twofold. Firstly, data read by each child from the input pipe is may change from run to run. This data is determined by many factors that are environment dependent and not necessarily program dependent. Secondly, the state of the design between one child and another tends to diverge over time because these children are not processing the same set of objects. As a result the parent may process different sets of objects in one run compared to another run of the same program on the same data. Furthermore, the order in which these objects are processed may differ too. Since the results of PDS are dependent upon the objects that the parent processes as well as the order in which they are processed, it may be desirable in some implementations to find a way to maintain these inputs to the parent consistent across different runs of PDS.

One manner of mitigating this problem is to ensure that child states do not change until some point of synchronization that is determined by the parent. This is done by not allowing children to apply any transform. They are only allowed to evaluate the transform. As a result, the state of the design in each child is identical to the state of the design at the time of last synchronization. Regardless of which child is evaluating the transform on an object the results will always match and the set of objects processed by the parent will remain the same across runs.

In another manner, to ensure that the parent processes children in the same order, the objects in the set created by the parent may be tagged with a sequence number at the time of list creation. After evaluation, each child returns not only successes but also failures along with the sequence number and the result of the evaluation. Upon receiving these results, the parent can reorder the objects as they are received from the children and reevaluate and apply them in the reordered sequence. This will ensure that the order in which the objects are processed is the same across runs as well. Note that the reordering and processing can be combined to form a dynamic reordering mechanism to speed up computation time.

In addition, based upon their evaluation, in some implementations children can recommend a set of promising actions that are most likely to bear good results for each object that they return as a success to the parent. The parent merely evaluates these actions in this small subset instead of going through the drudgery of a complete reevaluation over the entire set of actions that are possible. Leveraging work done by children in this manner effectively reduces the non-parallel computation of the run decreasing turnaround time.

Moreover, the process of creating and managing children has an overhead associated with it. This overhead is due to requirements such as initialization, generation of an object list, reporting, cleanup upon termination, effort involved in the forking process, etc. For transforms that run for a relatively short amount of time these overheads result in parallelization taking more time than the sequential process. In some implementations, therefore, transform collection may be used to mitigate this problem.

Let $TR=\{tr_1, tr_2, \ldots, tr_m\}$ be a collection of transforms and ti be the amount of time taken to complete a transform $tr_i \chi TR$. The time taken to complete the collection TR is $T=t_1+t_2+\ldots+t_m$. Let the extra time due to the overhead of parallelization be $t_o$. This overhead is largely independent of the number of transforms performed or the size of each transform. Furthermore, assume that parallelization reduces the time $t_i$ for a transform tr by a factor k. For the parallel run to take less time than the sequential run for tr, clearly $t_o+t_i/k \le t_i$, or $t_o \le t_i(1-1/k)$. When $t_i$ is small, the relation does not hold and parallelization is not justified. As $t_i$ increases parallelization becomes more and more attractive. The time T to process the collection TR is considerably larger that any $t_i$, $1 \le i \le m$. By choosing a collection TR such that to $<<T (1--1/k)$ considerable gains can be obtained by parallelization.

In an implementation that relies on collection, transforms may be queued rather than immediately executed. At various points, the queued set of transforms may be collectively run on an object. That is, one list of objects can be created and multiple queued transforms may be run on each object in the list, accepting each of the transforms that was successfully applied. Children may report back to the parent the set of transforms that were successful for each object. This consolidates the sequential processes and increases the run time per object which lends itself to the benefits of the herein-described parallel method, resulting in an overall run time improvement without compromising the quality of results.

Also, the ability to control child processes in the driver makes the implementation of FIG. 8 relatively robust and more fault tolerant. If a child should abort, only those objects that it has picked up from the pipe but not processed to completion will be lost. The rest of any work that may have been performed by this child will be picked up by other children resulting in a degradation of run time. Any effect in the quality of results will be marginal if at all.

The number of children that are forked is typically based upon an initial evaluation of the object list. A preliminary analysis of this list can be performed to come up with an optimum number of children that must be processed. Once the process has commenced, in some implementations the parent can start a monitoring process to control the number of children. If an estimate of the success ratio sr for children is known prior to list processing, then using the formulation given earlier the number of children to be started can be computed accurately based upon sr. However, this ratio is very much design dependent and while one can use the formulation as a guide line, it is desirable for the monitoring process to track the queue length at the parent input to determine whether to start new processes if the parent is idle or whether to kill existing children if the parent is overwhelmed.

The same monitoring process can also be used to keep track of any divergence between the children. Such divergence is possible because as children apply commands to their respective object subsets, they change their local copies of the design and do not see changes made by other children. In a robust system, information about such divergence can be transmitted back to the monitoring process which may periodically kill and restart children to ensure that the divergence does not get out of control.

Another potential use for such a monitoring process would be to ensure that memory utilization does not get out of hand. In programs such as PDS the portion of the design that is changed by any specific child may span several pages of memory. As a result the copy on write process that is invoked to ensure that processes do not step on each other may potentially result in excessive memory usage. The monitoring process may keep track of memory usage and kill children without affecting the quality of the result in order to keep memory usage within limits. This has the dual advantage of controlling divergence while at the same time resetting memory.

There may be additional opportunities available to speedup multi-process PDS that are dependent on platform characteristics. For example, memory and cache sizes may be exploited to ensure that the number of children spawned is optimum.

Additional modifications will be apparent to one of ordinary skill in the art having the benefit of the disclosure.

Figure 9:
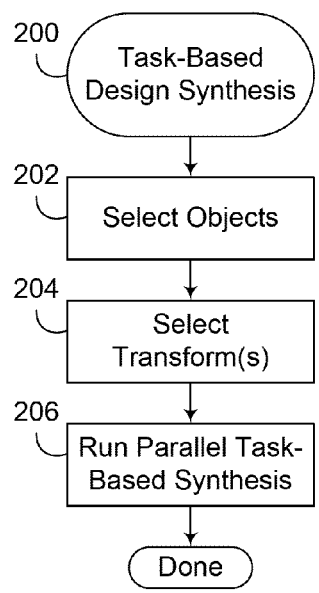
FIG. 9 is a flowchart illustrating an exemplary sequence of operations for another task-based multi-process design synthesis process capable of being implemented in the computer of FIG. 1.

Turning now to FIG. 9, several implementations of task-based multi-process design synthesis are discussed hereinafter. FIG. 9, in particular, illustrates a high level routine 200 for performing task-based multi-process design synthesis on an integrated circuit design in a manner consistent with the invention.

Routine 200 may be used, for example, to optimize an integrated circuit design by applying one or more transforms to objects in an integrated circuit design. Typically, routine 200 includes selection of objects (block 202) and selection of one or more transforms (block 204) to be performed on the selected objects. Once objects and transforms are selected, parallel task-based design synthesis as described herein is performed in block 206.

Typically, different optimizations are targeted to different types of objects, and as such, depending upon the type of optimization desired, object filtering may be performed to restrict the types of objects relevant to a particular type of optimization, e.g., logic gates for logic decomposition, nets with negative slack, long wires with excessive delay, etc.

In addition, the objects selected for processes can be ordered into lists, e.g., to prioritize objects for which optimization may be most beneficial. For example, it may be desirable to order objects based upon the nets with the most slack, the wires with the greatest delay, the geographic regions having poor characteristics, etc Otherwise, objects may be ordered based upon geographic location, or in other manners suitable for a given optimization. In other embodiments, no ordering of objects may be required.

Figure 10:
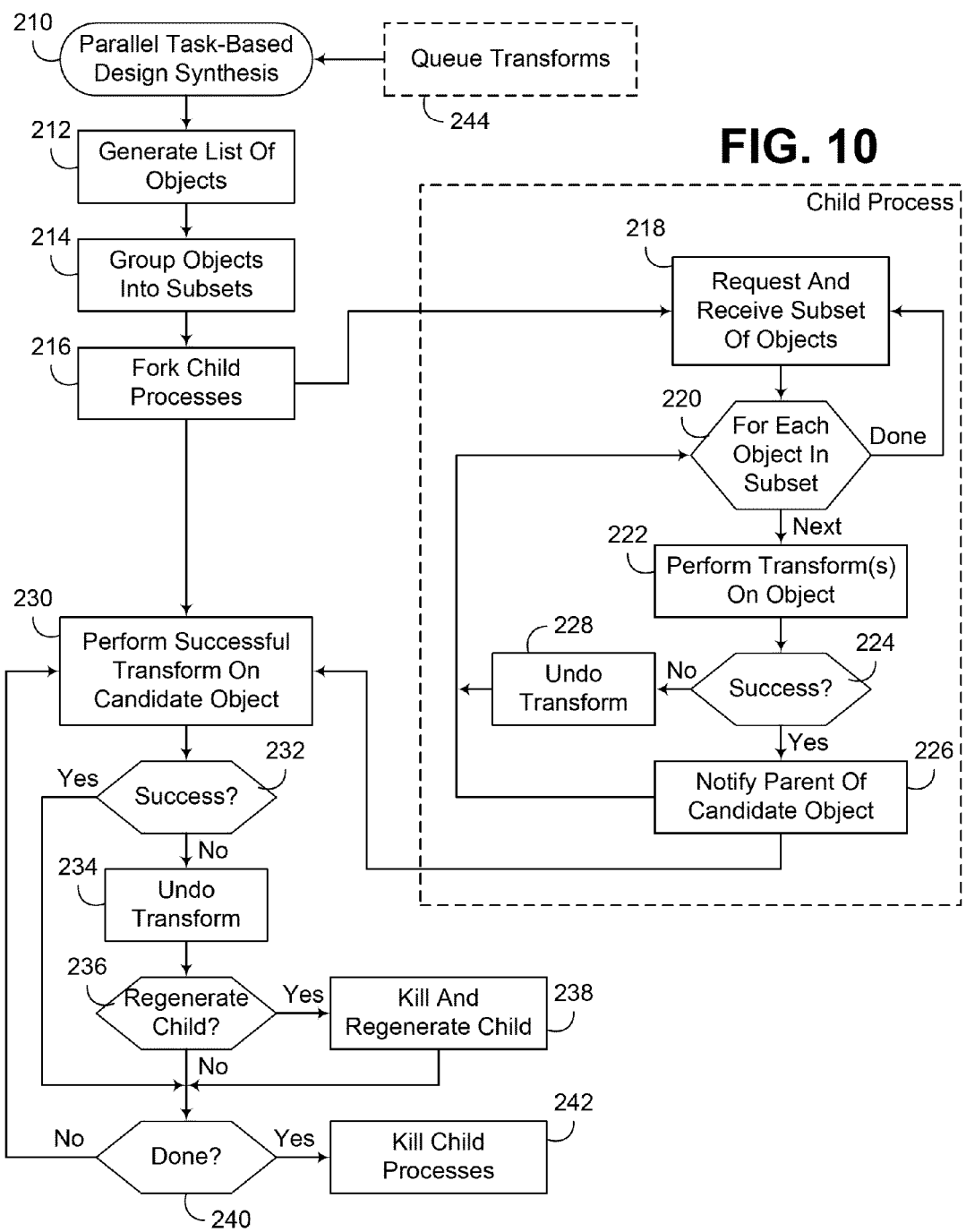
FIG. 10 is a flowchart illustrating a first implementation of the parallel task-based synthesis operation referenced in FIG. 9.

Task-Based Multi-Process Design Synthesis with Notification of Candidate Objects FIG. 10 illustrates an exemplary task-based multi-process design synthesis routine 210 consistent with the invention. Routine 210 is used to perform one or more transforms on a set of objects from an integrated circuit design. Routine 210 begins in block 212 by generating a list of objects. The ordering of the list may or may not be significant and is generated in a particular way depending on the goals of the subject optimization. For instance, it may be a list of boxes (cells) in the design ordered from logic output to logic input. Next, in block 214, the list of objects is grouped into subsets, e.g., with four objects per group. Next, in block 216, some number n child processes are generated, e.g., by forking the child processes. By virtue of the copy-on-write behavior of fork, each child process begins with an identical but independent view of the design. It will be appreciated that in other embodiments, the client processes may already exist and/or the copy of the integrated circuit design in the parent process may need to be separately copied to the client processes.

Next, in block 218, each child process requests and receives a group of objects from the original list. Then, as shown in block 220, a loop is initiated to process each object in the group received by the child process. For each such object, the child process executes or performs the transform on the object in block 222. Then, the child process tests/ evaluates the results of the transform in block 224 to determine whether performing the transform on the object was a success, i.e., whether the transform improved or otherwise optimized the design. If the transform succeeds, block 224 passes control to block 226 to return the identity of the object (e.g., handle or name) to the parent to notify the parent that performance of the transform on the object was successful. Doing so identifies the object as a candidate object to the parent. Control then returns to block 220 to process additional objects passed to the child.

Returning to block 224, if the result of the transform was not successful, block 226 is skipped, and the parent is not notified of the object. In addition, in some embodiments, it may be desirable to undo the transform on the child's copy of the design by passing control to block 228. In other embodiments, however, no undoing of the transform may be required.

For each candidate object returned to the parent process, the parent process performs the transform on the candidate object in block 230, thereby repeating the transform on the object on the parent's copy of the integrated circuit design. Block 232 then tests/evaluates the results of the transform. If the transform is successful, control passes to block 240 to determine whether any objects remain to be processed, and if so, block 240 returns control to block 230 to process additional objects returned from the child processes. Once all objects have been processed by the parent, block 240 passes control to block 242 to kill the child processes and otherwise clean up and terminate the routine.

If the transform is not successful, however, block 232 passes control to block 234 to undo the transform. Next, block 236 determines whether it is desirable to regenerate the child process associated with the unsuccessful transform, and if so, block 236 passes control to block 238 to kill and regenerate the child process, before passing control to block 240. If not, block 238 is skipped.

Blocks 236 and 238, which may be omitted in some embodiments, address the situation where the independent copy of the integrated circuit design in a child process diverges from that of the parent process over the course of the optimization. This divergence may be mitigated if it causes too many invalid successes (those which do not execute successfully in the parent) by killing the offending child process, or all child processes, and regenerating it/them. The behavior of fork is such that the new children are an identical snapshot of the parent, so regenerating a child process effectively updates the copy of the integrated circuit design for the child to match the current copy maintained by the parent. Block 236, for example, may track a number of invalid candidate objects identified by a particular child process (i.e., candidate objects that the parent determines to be unsuccessful), and pass control to block 238 whenever that number meets some divergence metric, e.g., when the number exceeds a threshold, the ratio of invalid candidate objects to total candidate objects exceeds a threshold, etc.

Routine 210 provides run time reduction when applying a transform to objects in a design by virtue of parallelizing the exploratory, nonproductive failing transformations. Typically, there is no speed up of the successful applications as they must still be performed by the parent. Thus, the lower the hit ratio, the more child processes may be used and the better the improvement. Further, if analysis for failures is expensive, then the improvement is greater.

In addition, by executing the transform in the parent as normal (but only for those objects where executing is likely to be successful), any changes that degrade quality, due to the children not seeing the effects of what other children are doing, will still be rejected by the parent. That is, the data from the children typically serve as suggestions, not commands.

An additional benefit is that each child sees the entire design and as such, there are no artificial boundaries introduced. Transforms that rely on globally significant information will have that data available. In addition, if any child process dies or is killed, the parent process will still typically be unaffected except for possibly missing some small number (depending on the group size) of potential optimizations. Further, children typically begin with a fresh, up-to-date view of the design.

Returning to FIG. 10, it may be desirable in some embodiments to queue transforms (block 244) in lieu of performing them individually. For some transforms, the amount of work to do for the transform may be too small and finish too quickly. As an example, consider a set of transforms ordered in a particular sequence. Say there are 20 such transforms. Each transform alone consumes a relatively short amount of time, say 60 seconds on average. While each transform individually is reasonably quick, the entire sequence is 20 minutes. When one of these transforms is parallelized, there is a certain amount of time that must be run sequentially, e.g., the initialization, generation of the list of objects, reporting, and cleanup. Plus, a small but noticeable amount of overhead may be added in forking the children, and collecting the results. Performing the transforms individually therefore would not produce a significant performance improvement over a non-parallel implementation.

For such situations, it may be desirable to collect multiple transforms and perform them collectively for each object. With a "collect" mode enabled, for example, transforms may be queued rather than executed (block 244). At various points, the queued set of transforms are performed all together. That is, one list of objects is created and all of the queued transforms are executed on each object, accepting each of the transforms that was successfully applied. Doing so consolidates the sequential processes and increases the run time per object, which lends itself to the benefits of a parallel methodology. Thus, block 222 may perform multiple transforms, and block 224 may test or evaluate each of the multiple transforms. Furthermore, block 226 may, in notifying the parent of a successful transform, also specify which transform that was successful, so that the parent, in block 230, will perform only those transforms for which the child has determined were successful.

Task-Based Multi-Process Design Synthesis with Notification of Transform Signatures While the implementation disclosed in FIG. 10 improves performance in design synthesis operations, the parent process is required to re-evaluate a transform that was already evaluated once in a child process that returned the given object as a success, or candidate object. If the level of effort required for the re-evaluation is high and/or the number of successful applications is high compared to the total number being evaluated, then the parent workload may be excessively high and limit the potential improvement derived from parallel operation.

It therefore may be desirable in some implementations to alter the data returned by child processes to the parent. Rather than returning just the target object and/or a success or failure flag, the child may instead return result data, e.g., in the form of a transform signature, that is usable by the parent process to reduce the overhead of performing the transform in the parent process. For example, the result data may include one or more instructions to be performed by the parent to replicate the child's result.

The result data may alternatively include one or more "hints," e.g., to narrow the workspace for the parent process by eliminating certain optimizations that might otherwise be tried when performing a transform, i.e., so that the parent process avoids performing at least one operation that the parent process would otherwise perform when performing the transform. As but one example, if a buffer optimization transform tries several different buffer configurations, a hint from a child process may specify one or more buffer configurations that should be tried by the parent process and/or one or more buffer configurations that the parent should not bother to try as they are known to not be productive. As an example, a child process may suggest that a four-way NAND be decomposed to two 2-way ANDs and a 2-way NAND.

A simple example is a resizing transform. For this transform, a logic gate may be mapped to a particular technology cell (e.g. a particular power level of a 2-way NAND). The transform may rebind this gate to some or all of the possible power levels provided by the technology cell library appropriate for that gate (e.g., all possible 2-way NAND power levels). It notes the effects on timing and area, then selects the one providing the best result for a given criterion (e.g. best for timing).

In the implementation of FIG. 10, a child process might note that there was an improvement possible for this particular gate. The parent would then repeat the same process performed by the child, trying some or all of the possible power levels, and select the best one. Through providing result data to the parent process, however, the child process may be able to indicate not only the particular gate to modify, but also the exact technology power level that was discovered to be best. The parent process would then be able to rebind the gate directly to this power level, and without having to retry all of the other possible power levels.

More complex transforms may work similarly but may require in some cases a chain of instructions similar to an engineering change order (ECO). Result data may also include tests that the parent may use to make a final go/no-go decision for each transformation. For the example above, such a test might be whether the timing did, in fact, improve. If not, the change would be discarded reverting to the original state. The tests are useful because the children are working independently and do not see changes made by other children. Those changes may alter the logic network sufficiently to alter the results of applying any specific transformation.

Figure 11:
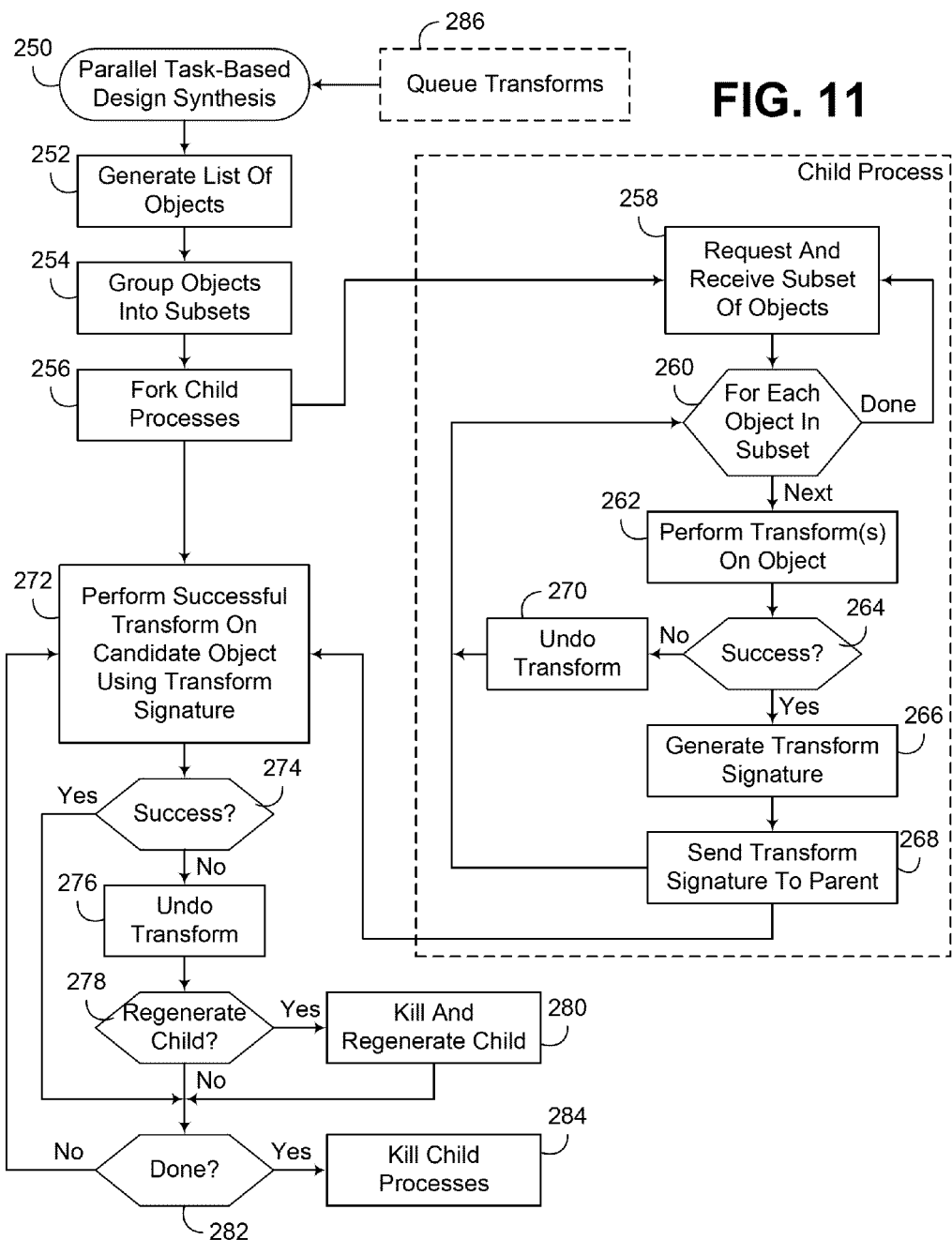
FIG. 11 is a flowchart illustrating a second implementation of the parallel task-based synthesis operation referenced in FIG. 9, utilizing transform signatures.

FIG. 11 illustrates a parallel task-based design synthesis routine 250 that reports result data from child processes to parent processes. Routine 250 begins in block 252 by generating a list of objects. Next, in block 254, the list of objects is grouped into subsets, e.g., with four objects per group. Next, in block 256, some number n child processes are generated, e.g., by forking the child processes. By virtue of the copy-on-write behavior of fork, each child process begins with an identical but independent view of the design.

Next, in block 258, each child process requests and receives a group of objects from the original list. Then, as shown in block 260, a loop is initiated to process each object in the group received by the child process. For each such object, the child process executes or performs the transform on the object in block 262. Then, the child process tests/evaluates the results of the transform in block 264 to determine whether performing the transform on the object was a success, i.e., improved or otherwise optimized the design. If the transform succeeds, block 264 passes control to block 266 to generate a transform signature, e.g., a set of instructions detailing how to replicate the transform on the object. Next, block 268 returns the identity of the object (e.g., handle or name) to the parent to notify the parent that performance of the transform on the object was successful. In addition, the transform signature is returned to the parent to reduce the overhead for the parent process when performing the transform. Control then returns to block 260 to process additional objects passed to the child.

Returning to block 264, if the result of the transform was not successful, blocks 266-268 are skipped, and the parent is not notified of the object. In addition, in some embodiments, it may be desirable to undo the transform on the child's copy of the design by passing control to block 270. In other embodiments, however, no undoing of the transform may be required.

For each candidate object returned to the parent process, the parent process performs the transform on the candidate object in block 272, thereby repeating the transform on the object on the parent's copy of the integrated circuit design. In addition, the parent process uses the result data in the transform signature to reduce the overhead of repeating the transform. For example, if the child process provides a set of instructions, the parent follows the instructions to repeat the transform. Optionally, the parent may also perform tests specified in the result data, either during or after applying the change instructions, and reject (by undoing) any changes that fail the tests.

Block 274 next tests/evaluates the results of the transform. If the transform is successful, control passes to block 282 to determine whether any objects remain to be processed, and if so, block 282 returns control to block 272 to process additional objects returned from the child processes. Once all objects have been processed by the parent, block 282 passes control to block 284 to kill the child processes and otherwise clean up and terminate the routine.

If the transform is not successful, however, block 274 passes control to block 276 to undo the transform. Next, block 278 determines whether it is desirable to regenerate the child process associated with the unsuccessful transform, and if so, block 278 passes control to block 280 to kill and regenerate the child process, before passing control to block 282. If not, block 280 is skipped.

The implementation of FIG. 11 may improve performance compared to the implementation of FIG. 10 in instances where the evaluation cost is high, perhaps due to many expensive choices that must be evaluated or to a complex and expensive algorithm needed to determine the proper action, or when the hit rate is high (the ratio of successes to evaluations). Such cases may swamp the parent with excessive workload, rendering the parent process a bottleneck on performance, so any reduction in workload in the parent can relieve any bottlenecks that otherwise may result.

In one exemplary implementation, result data may incorporate instructions, referred to herein as actions, defined as follows:

move_phys—move a gate to a new physical location
    move_pin—move a pin to a new net
    bind—change the technology cell binding for a gate
    insert—insert a new gate
    key—set a keyword on an object (gate, pin, or net)
    test—perform various tests This set of instructions may be used, for example, to generate signatures for a transform that inserts buffers into paths to resolve timing HOLD, or early mode, violations. To cover a broader range of transforms, other actions may be defined.

A variation of this implementation involves returning not the exact instructions or actions for the parent to perform but, instead, a set of hints the parent may use to reduce the analysis effort. An example makes this clearer. Suppose a transform is being performed to construct a buffer tree connecting a source to a set of sinks. Rather than providing the exact configuration along with all the buffer or inverter technology cells used, a child process may return just the topology of the tree, e.g., which sets of sinks are driven from the same buffer, the number of buffering stages, etc. This allows the parent some freedom to make some of the decisions based on the state of the design (such as buffer technology cells and the physical locations of the buffers). Since the design state is not identical to that of the child, this freedom expands the all-or-nothing approach described above while sacrificing some run time performance.

Task-Based Multi-Process Design Synthesis with Reproducible Transforms

In some instances, the aforementioned implementations may be subject to varying results from run to run due to the asynchronous nature of parallel processing. As an example, suppose there are nine nets to be examined (i.e., at which a transform will be attempted) labeled 1, 2, 3, 4, 5, 6, 7, 8, and 9. If three child processes, A, B, and C, are started, child A might work on nets 1, 2, and 3, child B might work on nets 4, 5, and 6, and child C might work on nets 7, 8, and 9. On a subsequent run, three child processes, A', B', and C', may again be started. In this case, child A' might work on nets 1, 2, and 5, child B' might work on 3, 6, and 9, and child C' might work on nets 4, 7, and 8. Because executing the transforms changes the state of the design, a transform that is successful at net 5 in child B might very well fail when it is evaluated by child A'. Thus, the parent may receive net 5 as a success in the first case but as a failure in the second.

In addition, the parent receives successes and applies the transform at those objects (nets in the example above) in the order they are sent by the children. The computer load and other issues outside the scope of the optimization system can also affect this order. Since the application of a transform may affect the success or failure of a subsequent transform application, the state of the design at the end of the parallel process can vary somewhat.

In some instances, consistency is generally desired even over potentially better results, because it provides a way to evaluate alternatives and understand cause and effect without the distraction of variation outside the scope of the designer's control.

These issues may be addressed through an alternate implementation that varies from the aforementioned implementations in two primary ways.

First, the parent may track the objects returned by the children relative to the original ordered list and ensure the execution of transforms will be done in the same order it sent them to the children. For instance if the parent receives object 6 but has not yet received object 5, it may wait for object 5 before executing the transform on object 6. This typically requires the child processes to return to the parent all objects, both successes and failures, to allow the parent to readily determine when it may proceed.

Second, the child processes may be configured to no longer accept changes. That is, they evaluate each transform and always undo the changes regardless of success/failure. After every transform trial, the design is always returned to its original state. This ensures every transform is tried on each object using an identical starting point. It doesn't matter which child is testing a transform on any particular object; the success or failure result will always be exactly the same. Further, the number of child processes has no bearing on the outcome.

Generally, there is no guarantee a particular transform that succeeds in a child for a particular object will also succeed in the parent. The parent is, in fact, applying the transforms, which alters its state from that in which the child performed its test. However, the successful application in a child will occur repeatedly for separate identical runs regardless of how many children are active or which child tests it. And, its success or failure in the parent will always be the same by virtue of the parent always executing the transforms on the given set of objects in the identical order. Thus, if a transform executing on object 21 prevents the successful application of the transform on object 36, this will be the case for any number of runs provided all other conditions are identical (no design, rule, or tool changes).

It may also be desirable for the parent to also provide a mechanism to allow it to avoid a deadlock situation due to the failure of a child. After waiting for some period, it can skip a missing object and process all remaining objects.

Figure 12:
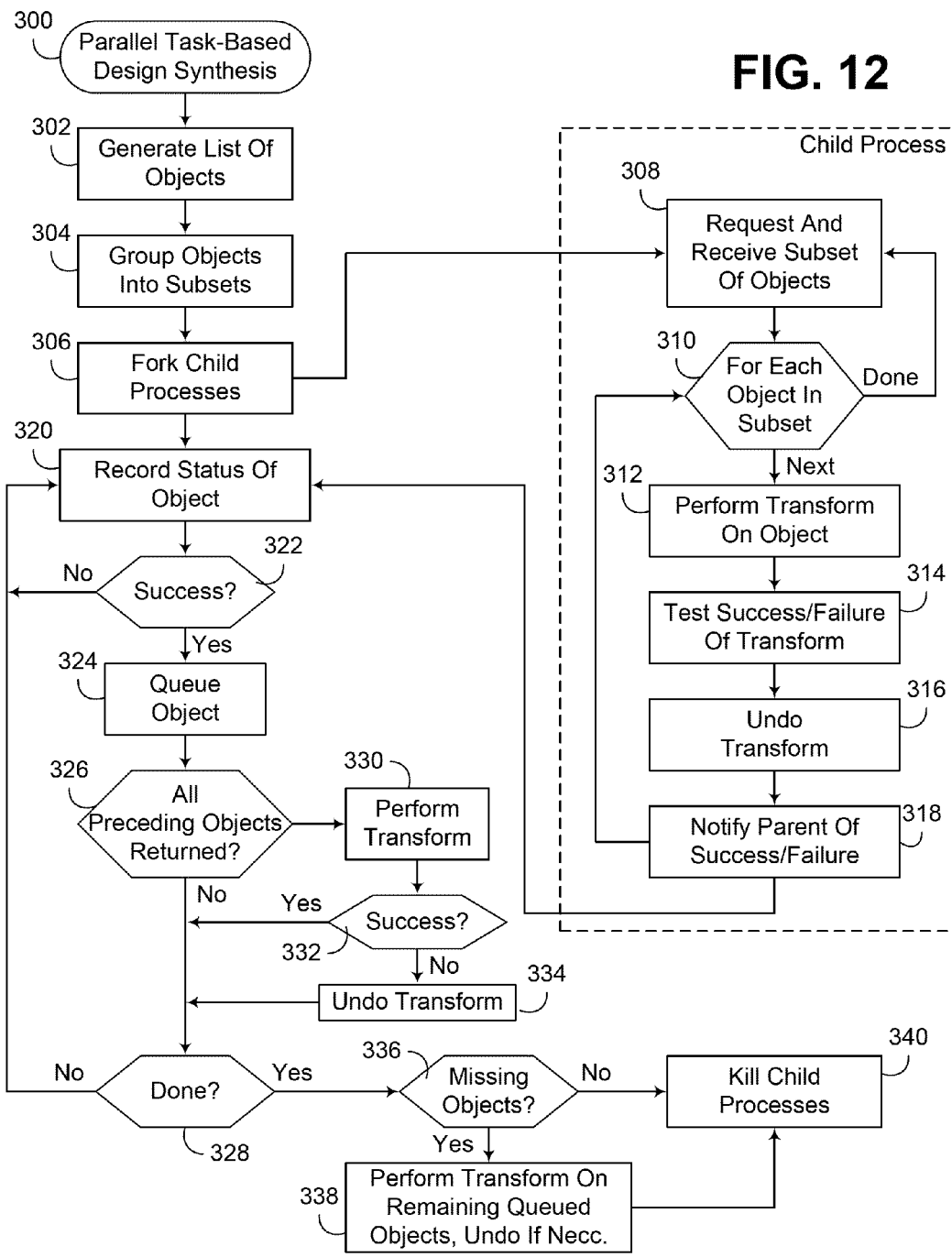
FIG. 12 is a flowchart illustrating a third implementation of the parallel task-based synthesis operation referenced in FIG. 9, utilizing reproducible transforms.

FIG. 12 illustrates a parallel task-based design synthesis routine 300 that utilizes reproducible transforms. Routine 300 begins in block 302 by generating a list of objects. Next, in block 304, the list of objects is grouped into subsets, e.g., with four objects per group. Next, in block 306, some number n child processes are generated, e.g., by forking the child processes. By virtue of the copy-on-write behavior of fork, each child process begins with an identical but independent view of the design.

Next, in block 308, each child process requests and receives a group of objects from the original list. Then, as shown in block 310, a loop is initiated to process each object in the group received by the child process. For each such object, the child process executes or performs the transform on the object in block 312. Then, the child process tests/evaluates the results of the transform in block 314 to determine whether performing the transform on the object was a success, i.e., improved or otherwise optimized the design.

Next, in block 316 the transform on the child's copy of the design is undone to restore the child's copy of the integrated circuit design to its initial state. Then, block 318 returns the identity of the object (e.g., handle or name) to the parent along with a success or failure flag to notify the parent whether performance of the transform on the object was successful. Control then returns to block 310 to process additional objects passed to the child.

For each candidate object returned to the parent process, the parent process records or logs the status of the object in block 320. Block 322 then tests whether the status returned for the object is success or failure. If failure, control returns to block 320 to log the results of the transforms for the other objects. If success, however, block 322 passes control to block 324 to queue the object.

Block 326 then determines whether all preceding objects to the instant object have been returned, and if not, passes control to block 328 to determine whether all objects have been processed. If not, block 328 returns control to block 320. If so, block 326 passes control to block 330 to perform the transform on the object, thereby repeating the transform on the object on the parent's copy of the integrated circuit design. Block 332 next tests/evaluates the results of the transform. If the transform is successful, control passes to block 328 to process additional objects. On the other hand, if not successful, control passes to block 334 to undo the transform, prior to passing control to block 328. In addition, in some embodiments it may be desirable to additionally perform the transform in sequence on each subsequent object in the queue up to the next object that has not yet been received, undoing any unsuccessful transforms as necessary.

Once all objects have been processed by the parent, block 328 passes control to block 336 to determine whether any objects were missing, i.e., for which no status was returned by a child process. If not, control passes to block 340 to kill the child processes and otherwise clean up and terminate the routine.

If missing objects do exist, however, block 336 passes control to block 338 to perform the transform on all remaining objects in the queue, undoing any unsuccessful transformations, e.g., as discussed above in connection with blocks 330-334. Control then passes to block 340 to terminate the routine.

It will also be appreciated that multiple transforms may be performed on objects in a collective manner, as noted above. In such an embodiment, the status for each transform on each object can be separately tracked and used to ensure that the transforms are applied in the same, reproducible order.

Various manners of tracking and queuing objects returned from child processes may be used. For example, tracking and queuing may be implemented using three arrays, a keyword, and a queue to do the ordering.

The first array is an array of objects, and the second array is a status array, the latter of which is set to processed, or not processed, or is an index into an array of successes. All of the entries in the status array start out as not processed. The third array is an array of successes, and stores all of the objects associated with successful child attempts. There is a keyword, so that, given an object, the corresponding index in the object and status arrays can be determined, and the queue contains the next success to be returned to the driver. There is also a current pointer, which stores the index of the next object needed in the sequence. This is the "leftmost" element of the array that is marked as not processed.

When a parent driver does a read, if the queue is not empty, the queue data is returned to the parent. If the queue is empty, and actual read is attempted.

READ_PROCESS:

Suppose a record comes back from the child. The object from the child data is used to get an array index for the status array from the object's keyword. If the child failed, the status for the index is marked as processed. If the child succeeded, the information from the child is put into the success array at the next available slot, S. The status index for the object is set to S. If the value of status_array[current_pointer] is no longer not processed, loop through the array until index of the next not processed entry is found and reset the current pointer to that index. During the loop, an entry that is neither processed nor not processed will be an index into the stored success array. This data will be pushed onto the queue and the corresponding index set to processed. If the queue is not empty, the top element from the queue is passed back to the driver parent.

END_PROCESS:

When end-of-file is found on the pipe and the queue is empty, the current pointer is reset to 0. At this point, if everything is OK, all the elements in the status queue should be marked as processed. An error message is given for anything marked not processed. Any index with a pointer into the success table is pushed onto the queue and marked as processed. The queue is emptied as read requests continue from the parent driver. This is to ensure that every object in the object array gets processed, one way or another.

An AGE_FACTOR may also be used when the difference between the index of an object from the child, N, and the current pointer exceeds the AGE_FACTOR. When that happens, every success that has been stored is released in processing similar to the END_PROCESS. That is, stored successes are queued and the indices are changed to processed. The current pointer is updated to be N. Processing proceeds as above, except for the case where the object index, OI, for a read from the child is less than the current pointer. If this happens, the current pointer is set to OI and processing proceeds as above.

Therefore, it can be seen that embodiments consistent with the invention provide enhanced parallelism for design synthesis to reduce runtimes therefor. Various modifications may be to the illustrated embodiments consistent with the invention. Therefore, the invention lies in the claims hereinafter appended.

What is claimed is:

1. A computer-implemented method of optimizing an integrated circuit design, the method comprising:
    executing a parent process and a plurality of child processes on at least one processor;
    in the parent process, generating a set of objects from the integrated circuit design upon which to perform a transform;
    in each child process of the plurality of child processes:
        performing the transform on each object of a subset of objects from the set of objects, including determining for each object of the subset of objects, whether such object is a candidate object for which performance of the transform has been successful; and
        notifying the parent process of any candidate object from the subset of objects for which performance of the transform has been determined to be successful; and
    in the parent process, performing the transform on each candidate object of which the parent process is notified by the plurality of child processes.

2. The method of claim 1, wherein the parent process and each of the plurality of child processes uses an independent copy of the integrated circuit design, wherein performing the transform in the parent process includes performing the transform using the independent copy of the integrated circuit design for the parent process, and wherein performing the transform in each child process includes performing the transform using the independent copy of the integrated circuit design for such child process such that performing the transform in each child process does not alter the independent copy of the integrated circuit design for the parent process.

3. The method of claim 2, further comprising:
    assigning the subsets of objects to the plurality of child processes; and
    in the parent process, forking the plurality of child processes, wherein forking the plurality of child processes generates the independent copy of the integrated circuit design for each of the plurality of child processes from the independent copy of the integrated circuit design for the parent process.

4. The method of claim 3, further comprising, in the parent process, killing and reforking a first child process among the plurality of child processes to regenerate the independent copy of the integrated circuit design for the first child process from the independent copy of the integrated circuit design for the parent process.

5. The method of claim 4, further comprising, in the parent process, determining for each candidate object whether such candidate object is an invalid candidate object for which performance of the transform by the parent process has not been successful, wherein killing and reforking the first child process is performed in response to determining that a number of invalid candidate objects of which the parent process is notified by the first child process meets a divergence metric.

6. The method of claim 1, further comprising queuing a plurality of transforms, wherein performing the transform in each child process includes collectively performing the plurality of transforms in each child process, and determining for each object of the subset of objects and for each transform among the plurality of transforms whether such object is a candidate object for which performance of such transform has been successful, and wherein performing the transform in the parent process includes performing only those transforms on only those candidate objects for which performance of such transform on such candidate object has been determined to be successful by a child process from among the plurality of child processes.

7. The method of claim 1, wherein the transform is a logic decomposition transform.

8. The method of claim 1, wherein the transform is an inverter removal transform.

9. The method of claim 1, wherein the transform is a buffer transform.

10. The method of claim 1, wherein generating the set of objects includes filtering the set of objects in the integrated circuit design based upon the transform being performed.

11. The method of claim 1, wherein the subsets of objects are assigned to the plurality of child processes, wherein performing the transform on each object of the subset of objects in each child process includes, in a first child process among the plurality of child processes, undoing the transform on a first object of the subset of objects in response to determining that performance of the transform has not been successful for the first object.

12. The method of claim 1, wherein performing the transform on the candidate object in the parent process includes determining whether performance of the transform on the candidate object has been successful, and if not, undoing the transform in the parent process.

13. An apparatus, comprising:
at least one processor; and
program code configured upon execution by the at least one processor to optimize an integrated circuit design using a parent process and a plurality of child processes executed by the at least one processor, wherein the parent process generates a set of objects from the integrated circuit design upon which to perform a transform, wherein each child process of the plurality of child processes performs the transform on each object of a subset of objects from the set of objects, determines, for each object of the subset of objects, whether such object is a candidate object for which performance of the transform has been successful, and notifies the parent process of any candidate object from the subset of objects for which performance of the transform has been determined to be successful, and wherein the parent process performs the transform on each candidate object of which the parent process is notified by the plurality of child processes.

14. The apparatus of claim 13, wherein the parent process and each child process of the plurality of child processes uses an independent copy of the integrated circuit design, wherein the parent process is configured to perform the transform using the independent copy of the integrated circuit design for the parent process, and each child process is configured to perform the transform using the independent copy of the integrated circuit design for such child process such that performing the transform in each child process does not alter the independent copy of the integrated circuit design for the parent process.

15. The apparatus of claim 14, wherein the program code is configured to assign the subsets of objects to the plurality of child processes, wherein the parent process is further configured to fork the plurality of child processes, and wherein forking the plurality of child processes generates the independent copy of the integrated circuit design for each child process of the plurality of child processes from the independent copy of the integrated circuit design for the parent process.

16. The apparatus of claim 15, wherein the parent process is configured to kill and refork a first child process among the plurality of child processes to regenerate the independent copy of the integrated circuit design for the first child process from the independent copy of the integrated circuit design for the parent process.

17. The apparatus of claim 16, wherein the parent process is configured to determine for each candidate object whether such candidate object is an invalid candidate object for which performance of the transform by the parent process has not been successful, wherein the parent process kills and reforks the first child process in response to determining that a number of invalid candidate objects of which the parent process is notified by the first child process meets a divergence metric.

18. The apparatus of claim 13, wherein the parent process is configured to queue a plurality of transforms, wherein each child process is configured to perform the transform by collectively performing the plurality of transforms, and determining for each object of the subset of objects and for each transform among the plurality of transforms whether such object is a candidate object for which performance of such transform has been successful, and the parent process is configured to perform the transform by performing only those transforms on only those candidate objects for which performance of such transform on such candidate object has been determined to be successful by a child process from among the plurality of child processes.

19. The apparatus of claim 13, wherein the transform is a logic decomposition transform.

20. The apparatus of claim 13, wherein the transform is an inverter removal transform.

21. The apparatus of claim 13, wherein the transform is a buffer transform.

22. The apparatus of claim 13, wherein the parent process is configured to generate the set of objects by filtering the set of objects in the integrated circuit design based upon the transform being performed.

23. The apparatus of claim 13, wherein the subsets of objects are assigned to the plurality of child processes, wherein each child process is configured to undo the transform in response to determining that performance of the transform has not been successful.

24. The apparatus of claim 13, wherein the parent process is configured to determine whether performance of the transform on the candidate object has been successful, and if not, undo the transform in the parent process.

25. A program product, comprising:
a non-transitory computer readable medium; and
program code stored on the non-transitory computer readable medium and configured upon execution to optimize an integrated circuit design using a parent process and a plurality of child processes executed by at least one processor, wherein the parent process generates a set of objects from the integrated circuit design upon which to perform a transform, wherein each child process of the plurality of child processes performs the transform on each object of a subset of objects from the set of objects, determines, for each object of the subset of objects whether such object is a candidate object for which performance of the transform has been successful, and notifies the parent process of any candidate object from the subset of objects for which performance of the transform has been determined to be successful, and wherein the parent process performs the transform on each candidate object of which the parent process is notified by the plurality of child processes.

* * * * *